(12) United States Patent
Kamasz et al.

(10) Patent No.: US 7,105,876 B1
(45) Date of Patent: Sep. 12, 2006

(54) RETICULATED GATE CCD PIXEL WITH DIAGONAL STRAPPING

(75) Inventors: Stacy R. Kamasz, Waterloo (CA); Simon G. Ingram, Waterloo (CA)

(73) Assignee: Dalsa, Inc., Waterloo (CA)

( * ) Notice: Subject to any disclaimer, the term of this patent is extended or adjusted under 35 U.S.C. 154(b) by 1029 days.

(21) Appl. No.: 10/079,425

(22) Filed: Feb. 22, 2002

Related U.S. Application Data

(60) Provisional application No. 60/270,580, filed on Feb. 23, 2001.

(51) Int. Cl.
*H01L 27/148* (2006.01)
*H01L 29/768* (2006.01)

(52) U.S. Cl. ............... 257/232; 257/233; 257/240; 257/E27.083; 257/E27.15

(58) Field of Classification Search ........... 257/231, 257/232, 233, 240
See application file for complete search history.

(56) References Cited

U.S. PATENT DOCUMENTS

| | | | |
|---|---|---|---|
| 3,502,802 A | 3/1970 | Osborn et al. | |
| 3,934,261 A * | 1/1976 | Sequin | ............... 257/241 |
| 4,375,652 A | 3/1983 | White | |
| 4,558,365 A | 12/1985 | Ochi | |
| 4,590,327 A | 5/1986 | Nath et al. | |
| 4,720,746 A | 1/1988 | Moore | |
| 4,943,710 A | 7/1990 | Sakama et al. | |
| 4,963,956 A | 10/1990 | Manabe et al. | |
| 4,972,254 A | 11/1990 | Endo et al. | |
| 5,099,333 A | 3/1992 | Shibusawa | |
| 5,488,239 A * | 1/1996 | Jung | ............... 257/231 |
| 5,502,319 A | 3/1996 | Kim | |
| 5,652,664 A | 7/1997 | Kusaka et al. | |
| 5,760,431 A | 6/1998 | Savoye et al. | |
| 5,923,061 A * | 7/1999 | Linnenbrink et al. | ...... 257/240 |
| 6,118,483 A | 9/2000 | Etoh | |

* cited by examiner

*Primary Examiner*—Ngân V. Ngô
(74) *Attorney, Agent, or Firm*—Millen, White, Zelano & Branigan, P.C.

(57) ABSTRACT

A sensor includes an array of pixels organized in rows and columns and a plurality of metal busses overlaying the array of pixels. A first column of pixels includes a proximal set of first pixels and a distal set of first pixels separated by a first jog region. A second column of pixels includes a proximal set of second pixels and a distal set of second pixels separated by a second jog region. The first jog region is displaced in a column direction and in a lateral direction transverse to the column direction from the second jog region. A first metal bus is insulatively disposed over both the first and second jog regions.

13 Claims, 8 Drawing Sheets

RETICULATED GATE CCD PIXEL WITH DIAGONAL STRAPPING

This application claims the priority benefit of the Feb. 23, 2001 filing date of provisional application Ser. No. 60/270,580, which is incorporated herein by reference.

BACKGROUND OF THE INVENTION

1. Field of the Invention

The technical field relates to time-delay and integration (TDI) charge coupled device (CCD) sensors, and, in particular, to sensors with reticulated gate CCD pixels and diagonal strapping.

2. Description of Related Art

When CCD sensors are operated in short wavelengths of ultra violet light, referred to as deep ultra violet (DUV), different regions of a CCD pixel have different responses to illumination. For example, polysilicon in regions covered with polysilicon will effectively absorb all incident DUV illumination so that no photon generated signal electrons are produced, resulting in areas of low quantum efficiency for DUV illumination. Conversely, regions covered with field oxide, or regions that are formed into photodiode or pinned photodiode, will permit DUV photons to enter a substrate and create photoelectrons that can be integrated to form signal charge, introducing areas of high quantum efficiency. The problem of variation in illumination responses by regions also occurs, to a lesser extent, with visible illumination, since polysilicon also has some absorption of visible light photons.

Figure 1:
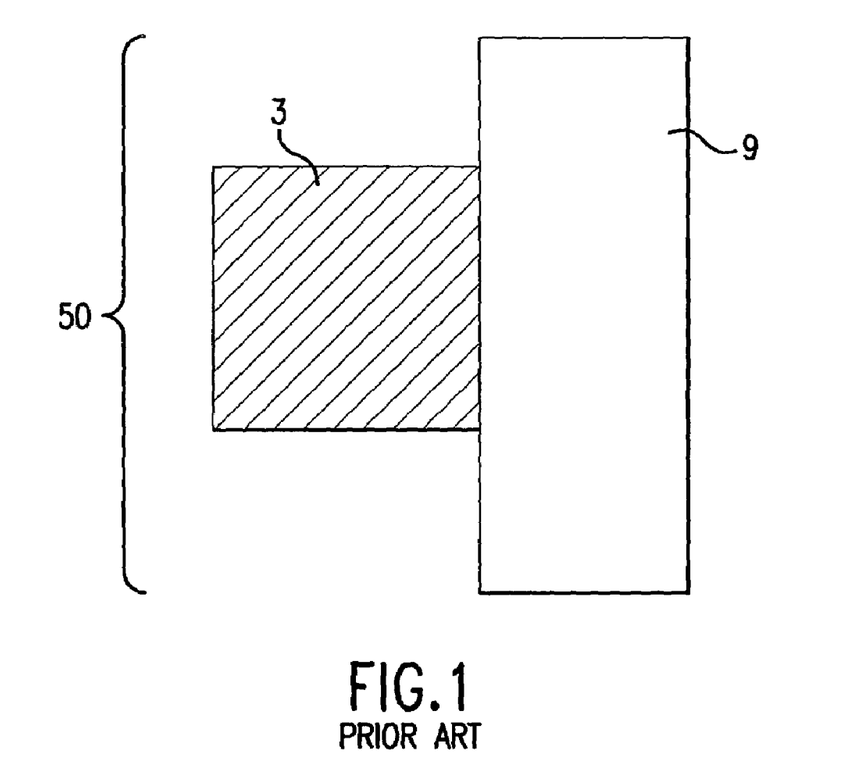
FIG. 1 illustrates a prior art device with a single CCD pixel and a localized region of high quantum efficiency.

FIG. 1 illustrates a prior art device with a single CCD pixel 50 that includes a localized region 3 of high quantum efficiency. The localized region 3 of high quantum efficiency is formed, for example, by creating a pinned photodiode region adjacent to a vertical CCD (VCCD) channel 9. This pixel architecture is often referred to as a "reticulated gate". In a conventional TDI imager, polysilicon CCD electrodes are continuous stripes across arrays of pixels. Here, these electrodes are "reticulated" over a portion of each pixel by deliberately removing polysilicon from areas of the pixel outside the VCCD channel 9, to enable localized regions of high quantum efficiency (e.g., region 3) to be formed as a photodiode or pinned photodiode.

Figure 2:
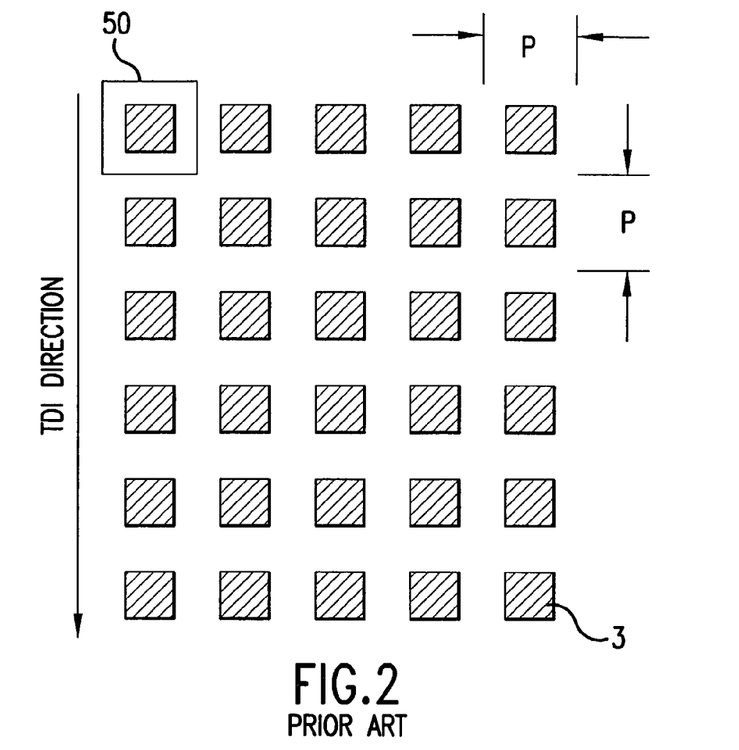
FIG. 2 is a schematic illustration of a group of pixels as shown in FIG. 1, organized into a TDI array.

Localized regions 3 of high quantum efficiency are disposed in rows and columns of a TDI array, as shown in FIG. 2. FIG. 2 is a schematic illustration of a group of individual pixels 50 of FIG. 1 organized into a TDI array to be used in TDI CCD sensors. The pixels 50 are spaced vertically and horizontally by a pixel pitch P. In this example, the TDI is in the vertical direction, pointing downwards toward the lower edge of FIG. 2.

Figure 3:
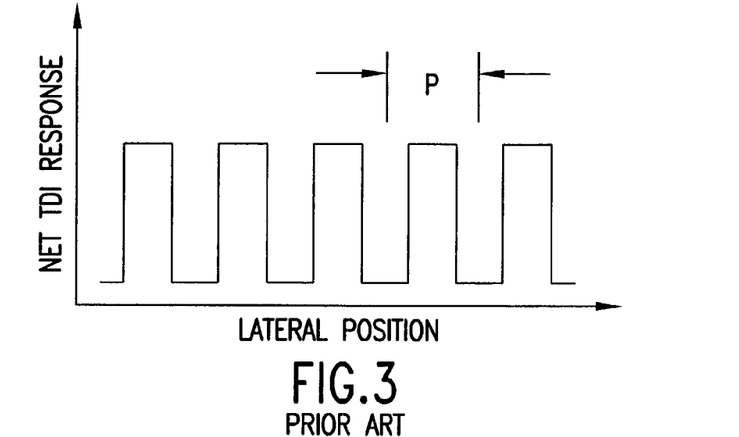
FIG. 3 is a graph showing a net TDI response of the columns of pixels in FIG. 2, where the imaging response is localized to the areas where the regions of high quantum efficiency within the pixels are laterally positioned.

FIG. 3 is a graph showing a net TDI response of the arrays of pixels 50 in FIG. 2. The TDI pixels 50 have localized regions 3 of high quantum efficiency, and regions between regions 3 have a comparatively lower response. The net TDI imaging response has peaks localized to these regions 3 of high quantum efficiency. The CCD pixel 50 has greater sensitivity to sense light at specific locations within the pixel 50. When an image contains patterns (e.g., stripes) at high spatial frequencies, for example, spatial frequencies that define patterns that repeat more often than the pixel pitch (i.e., above Nyquist rate), and a fill factor of the sensor pixels is less than 100 percent, spurious shapes of the resulting image typically appear, a phenomenon creating aliasing. Aliasing can be reduced by blurring the image, hence reducing the high spatial frequencies in the image. Blurring is typically achieved by lens defocusing or with an anti-aliasing filter, either optically or electronically.

One approach for reducing aliasing, and consequently, enhancing modulation transfer function (MTF), is to position a shift region (i.e., a jog region) in the array of pixels 50 to maintain uniformity of response. The localized region 3 of high quantum efficiency is shifted by a fraction of one pixel pitch, so that the jog region enables a whole column of pixels 50 in the TDI array to generate a more uniform level of response, resulting in enhanced MTF.

Figures 4, 5:
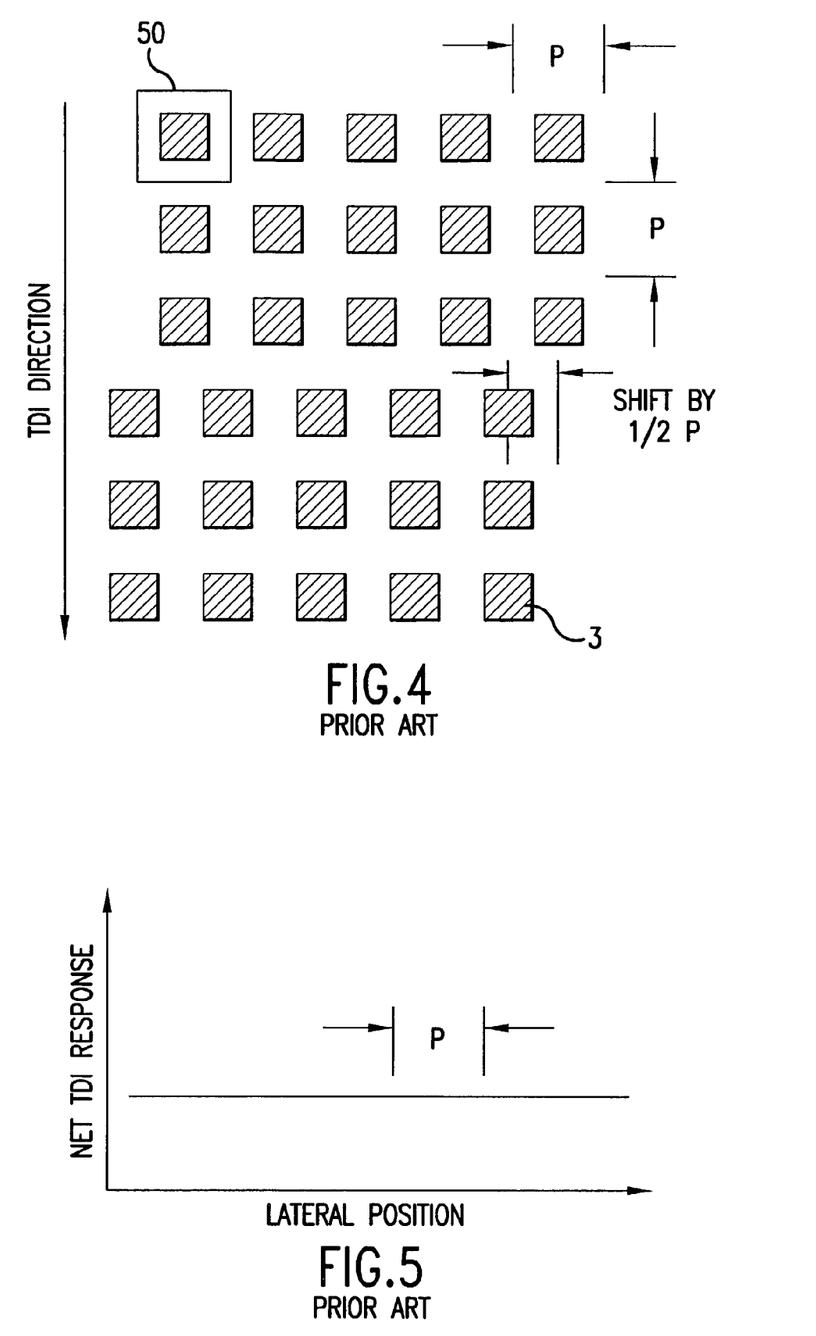
FIG. 4 is a schematic illustration of a group of pixels of FIG. 2, with a shift or jog region in the lateral pixel position halfway through the array to enhance MTF.
FIG. 5 is a graph showing the net TDI response of the columns of pixels in FIG. 4, where the imaging response is no longer localized to specific lateral areas.

FIG. 4 is a schematic illustration of a group of pixels 50 of FIG. 2, with a lateral position shift region halfway down a column of the array. Referring to FIG. 4, one-half of the pixels 50 in the array have a lateral shift by ½P midway down the array. As a result, the lateral shift creates a more uniform net TDI response even with a localized area of enhanced quantum efficiency or photoresponse within each pixel 50. FIG. 5 is a graph showing the net TDI response of the columns of pixels 50 in FIG. 4, where the imaging response is no longer localized to specific lateral areas.

Figure 6:
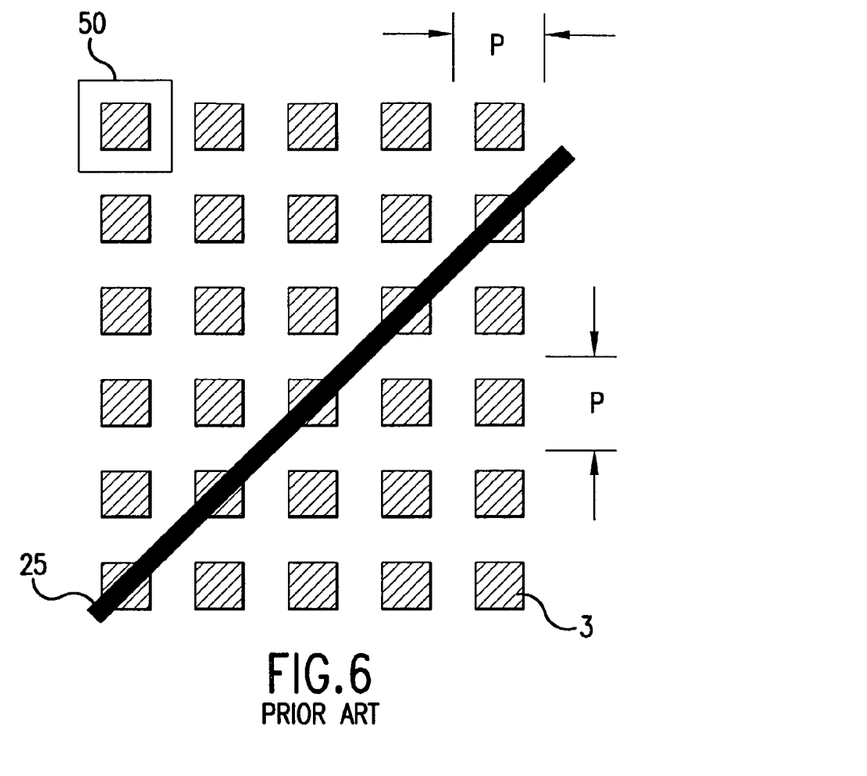
FIG. 6 is a schematic illustration of a group of pixels of FIG. 2, with a single metal bus present within the array of pixels.

In another aspect of TDI CCD sensor design, metal bussing is introduced into the array of pixels 50 to reduce resistance capacitance (RC) time constants of polysilicon clocking, and to maintain a high fill factor of the TDI imaging region. FIG. 6 is a schematic illustration of the group of pixels 50 of FIG. 2, with a single metal bus 25 overlaying the array of pixels 50, but without MTF-enhancing offset in pixel position. One metal bus 25 is shown for purposes of illustration.

Figure 7:
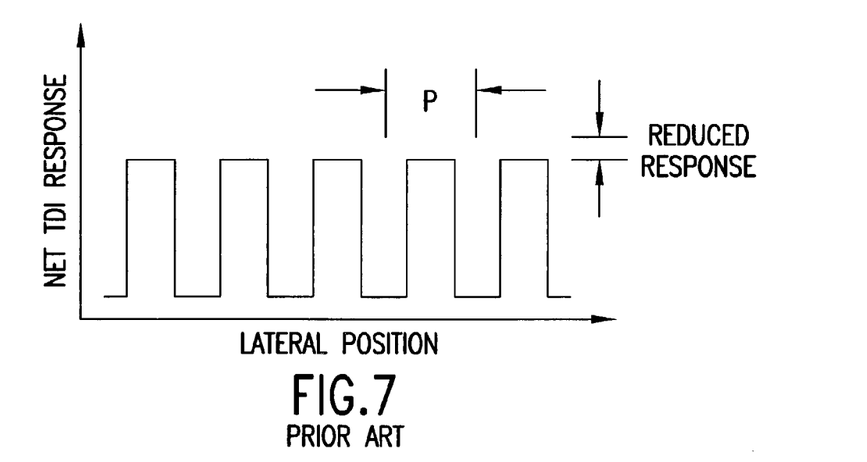
FIG. 7 is a graph showing the net TDI response of the columns of pixels in FIG. 6, where the imaging response is localized to specific lateral areas, and has been reduced slightly by the presence of metal bussing.

FIG. 7 is a graph showing the net TDI response of the columns of pixels 50, where the imaging response is localized to specific lateral areas (as in FIG. 3), but has been reduced slightly in all pixel columns by the shadow effects of the metal bussing. However, the localized response is still present in this example, as in FIG. 3.

The benefit of MTF-enhancement architectures and metal bussing structure can be combined by positioning the jog region (as in FIG. 4) and metal bussing (as in FIG. 6) into a single TDI array. However, the addition of opaque metal bussing to a TDI array using MTF-enhancing offsets in pixel position introduces pixel response nonuniformity (PRNU). Specifically, the localized regions 3 of high quantum efficiency within a pixel 50 may or may not be covered, depending on the specific location of metal bussing in the array. Therefore, vertical columns may not have the same effective fill factor in the DUV, creating nonuniformity of response between columns. PRNU is demonstrated in FIG. 8 and FIG. 9.

Figure 8:
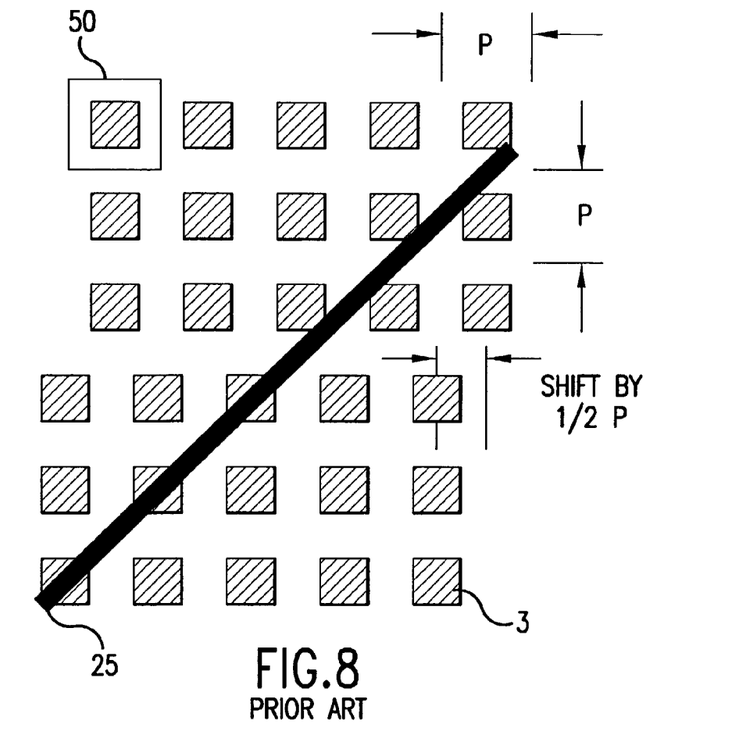
FIG. 8 illustrates an array of pixels of FIG. 2, with both MTF-enhancing architectures and metal bussing structure.
Figure 9:
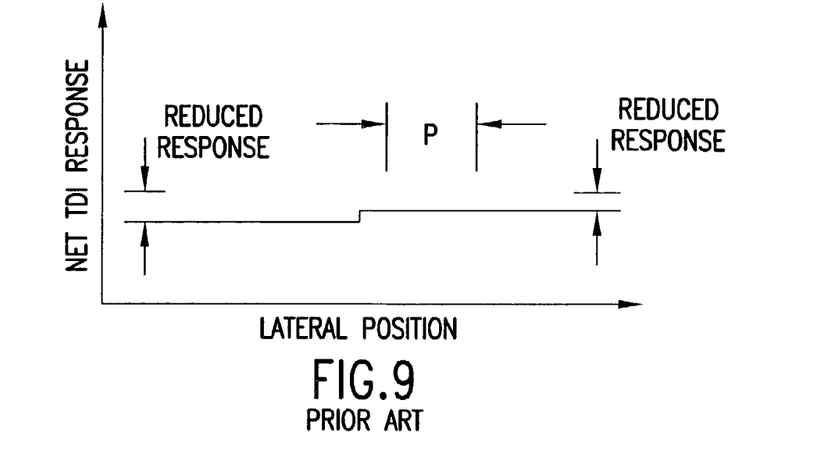
FIG. 9 is a graph illustrating the net TDI response of the array of pixels in FIG. 8, showing a dissimilar response between the two regions of the array.

FIG. 8 is a plain view of an array of pixels 50 of FIG. 4, with MTF-enhancing architectures, and with metal bussing structure of FIG. 6. The metal bus 25 crosses dissimilar portions of the pixel 50, depending on where the metal bus 25 is positioned in the array, creating asymmetric response. FIG. 9 is a graph illustrating the net TDI response of the array of pixels in FIG. 8, showing a dissimilar response between the two regions of the array.

Since a CCD typically has many clock phases requiring many metal busses 25, and multiple lateral shifts of pixel position may be needed to enhance MTF, a complex and irregular response will likely be introduced. One possible solution is to create layout geometries where the metal busses 25 occupy the same portion of each pixel. However, this solution requires complex layouts to shift the metal busses 25 across the array in such a way that all TDI columns are affected equally.

SUMMARY OF THE INVENTION

In one embodiment of the invention, a sensor includes an array of pixels organized in rows and columns and a plurality of metal busses overlaying the array of pixels. A first column of pixels includes a proximal set of first pixels and a distal set of first pixels separated by a first jog region. A second column of pixels includes a proximal set of second pixels and a distal set of second pixels separated by a second jog region. The first jog region is displaced in a column direction and in a lateral direction transverse to the column direction from the second jog region. A first metal bus is insulatively disposed over both the first and second jog regions.

In another embodiment of the invention, a method includes positioning jog regions in columns of an array of reticulated gate TDI CCD pixels so that the jog regions in adjacent columns are offset horizontally and vertically. The method further includes positioning metal busses over the array so that the metal busses are disposed diagonally and overlay the jog regions. The method further includes positioning the metal busses to repeat with one metal bus every N pixels horizontally and vertically where N is a predetermined integer.

In still another embodiment of the invention, a sensor includes an array of pixels organized in rows and columns and a plurality of metal busses overlaying the array of pixels. A first column of pixels includes a proximal set of first pixels and a distal set of first pixels separated by a first jog region. A second column of pixels includes a proximal set of second pixels and a distal set of second pixels separated by a second jog region. A first metal bus is insulatively disposed over both the first and second jog regions. The proximal set of first pixels is disposed along a first proximal line parallel to the column direction, and the distal set of first pixels is disposed along a first distal line parallel to the column direction. The first proximal and distal lines are displaced by a fraction of a pixel pitch in the lateral direction.

BRIEF DESCRIPTION OF DRAWINGS

The preferred embodiments of the method and apparatus for providing uniform TDI response for DUV imaging will be described in detail with reference to the following figures, in which like numerals refer to like elements, and wherein.

DETAILED DESCRIPTION OF PREFERRED EMBODIMENTS

Time-delay and integrate (TDI) charge coupled device (CCD) sensors operate using reticulations cut in the polysilicon gate electrodes of each pixel to enhance photo response in deep ultra violet (DUV). Metal busses are used to reduce resistance capacitance (RC) time constants of polysilicon clock lines and speed charge transfer. Since a single reticulated TDI pixel includes areas of dissimilar quantum efficiency, one or more jog regions are included in each vertical charge coupled device (VCCD) operating as a TDI column to reduce alaising, enhance modulation transfer function (MTF), and maintain good uniformity of response.

A "jog region" is defined as a region in the VCCD where the VCCD includes a lateral shift (i.e., a lateral jog) in a horizontal position. The shift in lateral position (i.e., horizontally) is within the space of one horizontal pixel pitch. This architecture is contrasted with a conventional TDI imager, where the VCCDs used for TDI integration usually have a fixed lateral position along the entire vertical length of the VCCD.

In a preferred embodiment, a TDI CCD sensor includes an array of reticulated gate TDI CCD pixels with overlaying diagonal metal strapping disposed at such locations as to provide uniform TDI response for DUV imaging. Each VCCD in the TDI sensor includes one or more jog regions positioned in the arrays of reticulated gate TDI CCD pixels. The several jog regions are offset horizontally and vertically from each other. The metal busses of the sensor are positioned within the array of reticulated gate TDI CCD pixels at predetermined angles so as to be diagonally disposed over the sensor and overlay only jog regions. Jog regions are disposed within the array so that two jog regions, that corresponds with one metal bus, are disposed every N pixels horizontally and vertically, where N is a predetermined integer (see FIG. 11). This provides uniform TDI response for DUV imaging as described herein.

In an alternative embodiment, a method for providing uniform DUV imaging in a TDI CCD sensor includes positioning jog regions VCCD columns of an array of reticulated gate TDI CCD pixels in the sensor. As described above, the jog regions are offset horizontally and vertically from each other. The method further includes positioning metal busses in the array of reticulated gate TDI CCD pixels so as to be disposed diagonally over the sensor and overlay only the jog regions. The jog regions are positioned along a diagonal line extending across the TDI array at an angle. Likewise, the metal busses transverse diagonally across the TDI array at an angle, creating diagonal strapping. One metal bus overlays a jog region every N pixels, horizontally and vertically, allowing DUV imaging while maintaining good uniformity of TDI response.

The method for providing uniform TDI response for DUV imaging is applicable to all non-100 percent fill factor designs (for the high quantum efficiency reticulated region of each pixel) that use TDI type clocking architecture. The method uses spatial offsets of the high quantum efficiency imaging aperture on each TDI row (e.g., the jog region in each VCCD) to effectively average out the imaging aperture function to a smooth but less than 100 percent fill factor (i.e., 100 percent spatial coverage but less than 100 percent open aperture). The spatial offsets may be step functions or smooth functions, such as sine wave, a triangle wave, or ellipsoidal wave. Any set of offsets may be used, provided the open aperture of the pixel (e.g., region of high quantum efficiency such as the photodiode or pinned photodiode) spatially shifts to cover the entire spatial window of the pixel (i.e., on pixel pitch). The shape of the offsets may affect aperture function smoothing efficiency.

Figure 10:
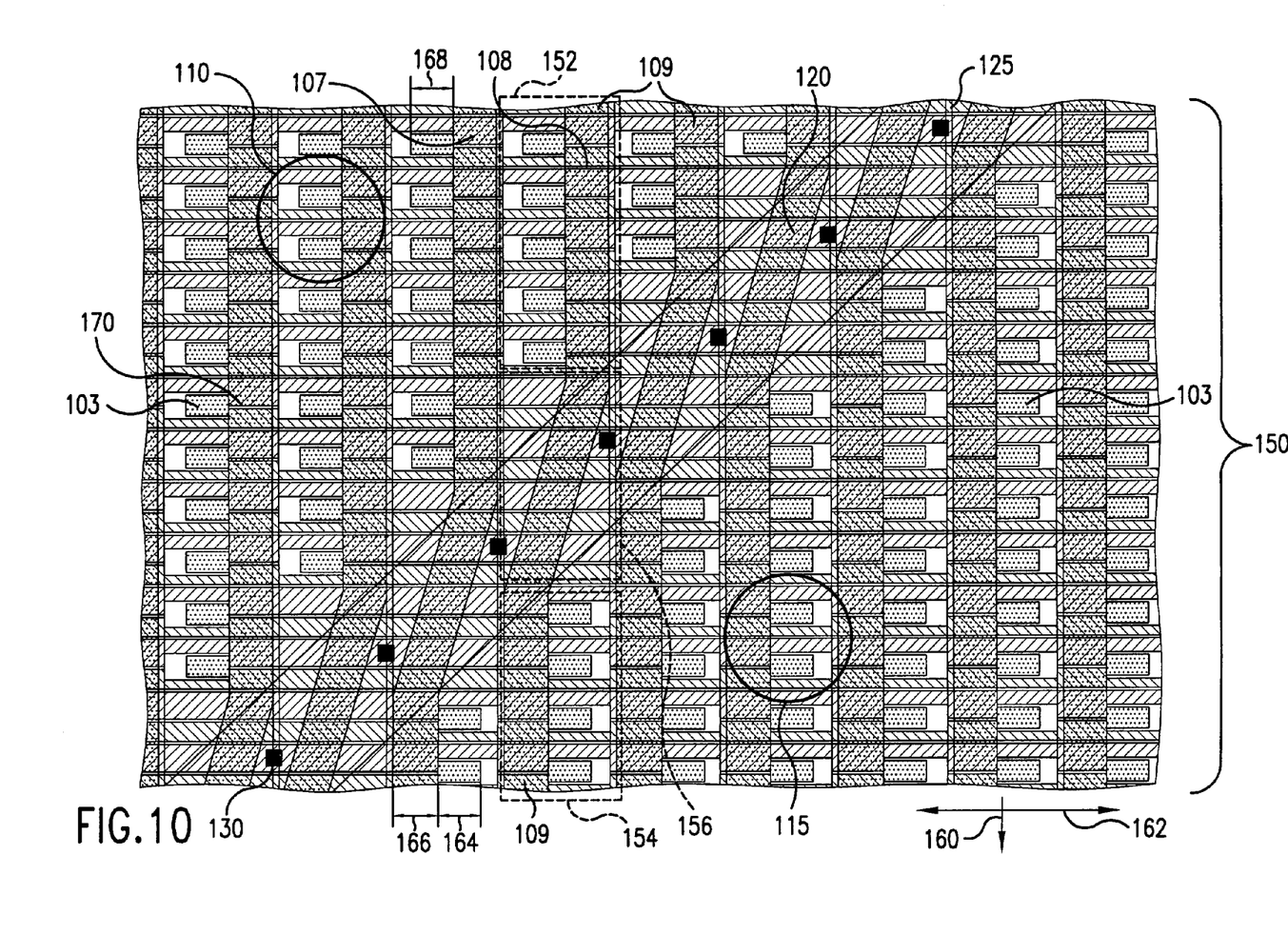
FIG. 10 illustrates an exemplary apparatus for providing uniform TDI response for DUV imaging, with overlaying jog region and metal bussing.

FIG. 10 illustrates an exemplary apparatus for providing uniform TDI response for DUV imaging with metal bussing overlaying jog regions. In FIG. 10, an array of pixels 150 includes VCCD channels 109 (typ.), which are adjacent to DUV-sensitive photodiode or pinned photodiode regions 110, 115. The array of pixels 150 include left hand polarity pixels 110 and right hand polarity pixels 115. Polysilicon electrodes 107, 108, are insulatively spaced over and disposed transversely to the channels, and are operate in TDI mode over the VCCD channels 109 (typ.).

To eliminate aliasing and enhance MTF, one or more jog regions 120 are positioned in each VCCD channel 109. A jog region is positioned wherever the pixel polarity changes from left to right and vice versa. The jog regions 120 effectively shift the position of the photodiode or pinned photodiodes 103 from left polarity pixels 110 to right polarity pixels 115 within one pixel pitch. The jog regions 120 do not have DUV photoresponse because the jog regions 120 are typically covered with polysilicon. The jog regions 120 help to create a more uniform net TDI response even with a localized area of greater photo response within a portion of each pixel. The jog regions 120 in adjacent VCCDs are positioned along a diagonal line at an angle (for example, a 45 degree angle) with respect to a column direction across the TDI array. Each jog region 120 displaces the lateral position (i.e., transverse to the column direction) of the line of high quantum efficiency regions in a single VCCD by an extent less than one pixel pitch. Jog regions in one VCCD are displaced from jog regions in adjacent VCCDs within one pixel pitch vertically and horizontally. The 45 degree angle is for illustration only. One skilled in the art in light of these teaching will appreciate that other angles may be used depending on the aspect ratio of the pixels.

Metal busses 125 (typ.) are disposed in the array over the jog regions 120. The metal busses contact the underlying polysilicon clock lines (e.g., 107, 108) for corresponding clock phases through via contacts 130 to reduce resistance capacitance (RC) time constants of polysilicon clock lines. The metal busses 125 contact the underlying polysilicon electrodes 107, 108 through contact cuts 130 in the interlayer dielectric. The metal busses 125 transverse diagonally across the TDI imaging region at an angle (for example, a 45 degree angle) creating diagonal strapping. The 45 degree angle is for illustration only. One skilled in the art will appreciate that other angles may be used depending on the aspect ratio of the pixels.

Figure 11:
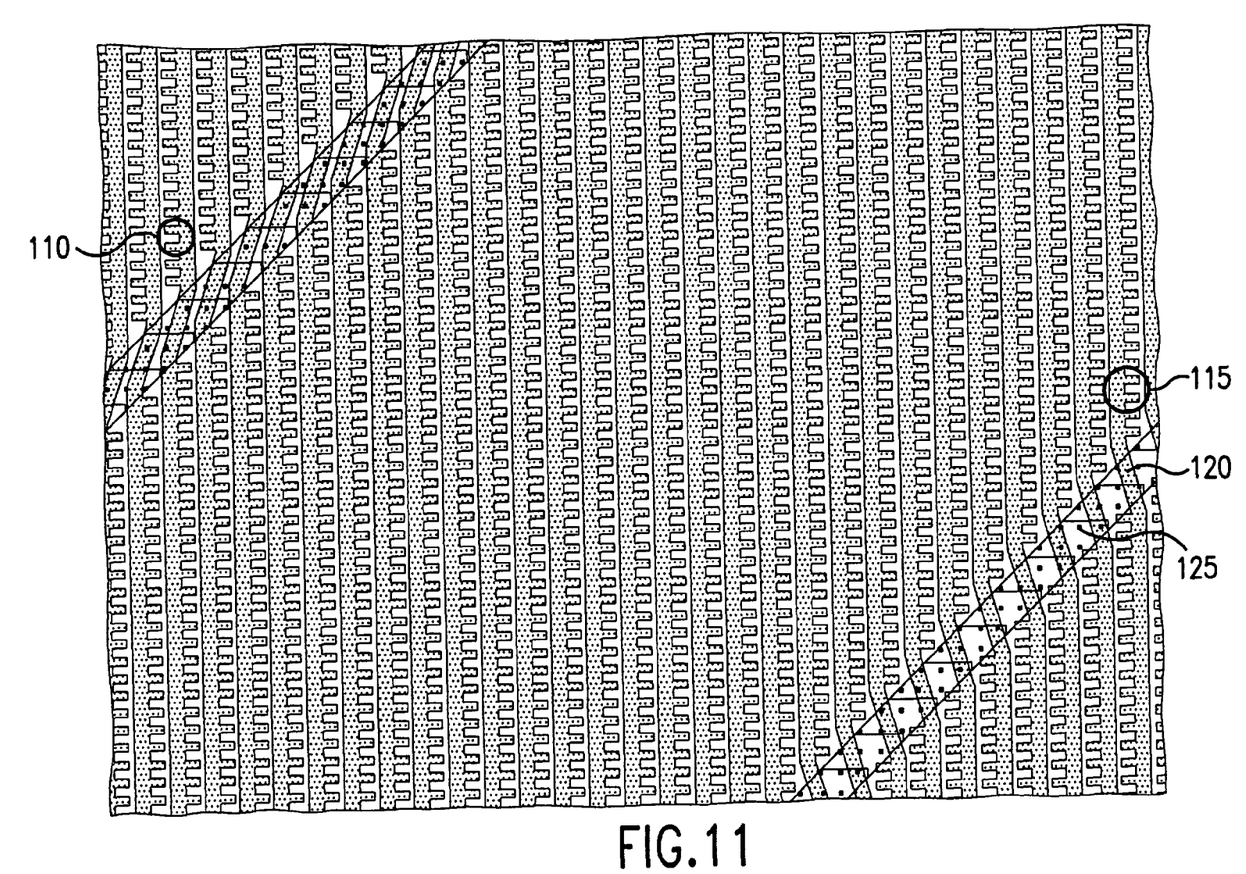
FIG. 11 is a plot of an active layer, i.e., CCD channel, and a metal layer of a larger region of the exemplary apparatus in FIG. 10.

FIG. 11 is a plan view showing a composite of layers of a sensor according an embodiment of this invention (i.e., the CCD channel 109 layer and the overlaying metal layer of a region of a sensor, a larger region than the region depicted in the exemplary sensor of FIG. 10). Referring to FIG. 11, one metal bus 125 is positioned every N pixels in the vertical and horizontal direction (in this example, N equals 64, but N may be another predetermined integer). Likewise, one jog region 120 (transition from left hand polarity to right hand polarity) is positioned every N pixels in the vertical and horizontal direction.

In order for a TDI imager to have a minimized pixel response nonuniformity (PRNU), each TDI column needs to have an equivalent response. Accordingly, each TDI column (i.e., VCCD) is configured to have one or more jog regions. The regions of high quantum efficiency in the pixels of the same VCCD are distributed laterally so that the average response of the high quantum efficiency regions (averaged over the column) is evenly distributed over the lateral extent of a horizontal pixel pitch. For DUV imagers, the metal busses 125 and the polysilicon electrodes 107, 108 may be regarded as substantially opaque to DUV illumination. The reticulations in the polysilicon clock lines that expose an underlying photodiode or pinned photodiode provide most of the DUV response. By distributing these regions of high quantum efficiency from the same VCCD evenly within a pixel pitch, PRNU can be minimized.

If the metal busses 125 were to be located outside the jog region 120, in some TDI columns, the metal busses 125 may cover high quantum efficiency regions within the pixel that are photoactive to DUV, while in other TDI columns, the metal busses 125 may cover the jog region 120 or other regions covered with polysilicon gate electrodes, which have negligible photo activity in the DUV imaging region. Therefore, each column may not necessarily have the same effective fill factor, and thus, response. Such an architecture may therefore introduce PRNU to the imaged scene.

However, by restricting the diagonal metal busses 125 to overlay the jog regions 120, as in the present invention, the opaque metal busses 125 only overlay the VCCD jog regions 120 or other regions covered with DUV opaque polysilicon, rather than DUV sensitive regions (e.g., photodiodes and pinned photodiodes). As a result of the present invention, all TDI columns have low or no PRNU (because of the averaging effect of the jog regions) in the DUV imaging region.

The metal busses 125 consistently cover the same VCCD structure (i.e., the jog region 120) wherever the metal busses 125 are disposed across the imaging region. Therefore, the same TDI sensor may be operated in visible light without any anomalous systematic PRNU introduced by the metal busses 125.

If the metal busses 125 do not overlay the jog regions 120 in contrast to the present invention, the jog regions 120 may be photoactive with visible illumination, and may integrate photocharge, albeit with less efficiency than the photodiode regions or the pinned photodiode regions. Consequently, the photo response of the several TDI columns may vary depending on the extent to which the metal busses 125 cover the jog regions 120 or reticulated regions. Thus, as a general proposition, the TDI columns do not have same responses, since the TDI columns may not have equivalent average fill factors.

In the present invention, the photo response for each column comes primarily from the photodiode or pinned photodiode regions, since the metal busses 125 only overlay the lower response jog regions 120 covered with polysilicon, not the photodiode or pinned photodiode regions. Therefore, since in the present invention the metal busses 125 overlay only the jog regions 120, the photo response of each TDI column is equivalent.

Figure 12:
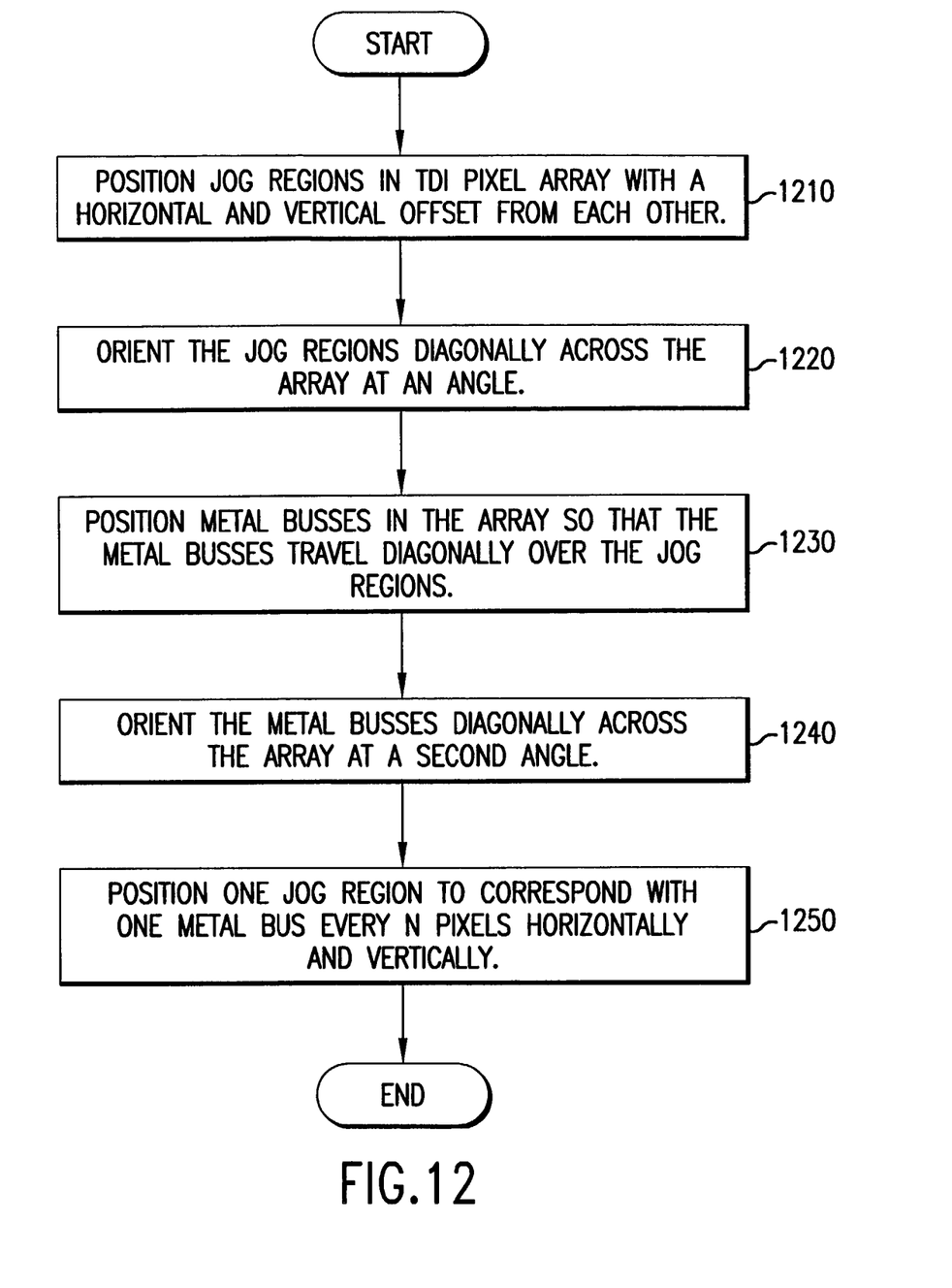
FIG. 12 is a flow chart illustrating the method for providing uniform TDI response for DUV imaging.

FIG. 12 is a flow chart illustrating the method for providing for uniform TDI response for DUV imaging using CCD sensors. In step 1210, jog regions between adjacent portions of a VCCD are positioned in the array of TDI pixels with a horizontal and vertical offset from jog regions in adjacent VCCDs. The jog regions offset the adjacent portions of the VCCD horizontally within one pixel pitch from each other. In step 1220, the jog regions in the VCCDs of the TDI array are disposed in a line that is oriented diagonally across the TDI array at an angle, for example, a 45 degree angle. In step 1230, metal busses are disposed diagonally over the array of TDI pixels so that the metal busses overlay the jog regions. In step 1040, the metal busses are oriented diagonally across the TDI array at a second angle that is the same as the angle as the line at which the jog regions are disposed, for example, 45 degrees. In step 1250, metal busses are repeatedly disposed diagonally so that one jog region corresponds with one metal bus, for example, every N pixels, horizontally and vertically, allowing proper DUV imaging while maintaining good uniformity of TDI response.

In another embodiment illustrated in FIG. 10, a sensor includes array of pixels 150 organized in rows and columns and a plurality of metal busses overlaying the array of pixels. In FIG. 10, a single bus 125 is illustrated. In FIG. 11, two busses are illustrated. Persons of ordinary skill in the art will appreciate that a complete metal strapped TDI sensor will include at least one metal bus for each clock phase.

In this embodiment a first column of pixels includes a proximal set of first pixels (see 152, FIG. 10) and a distal set of first pixels (see 154, FIG. 10) separated by a first jog region (see 156, FIG. 10). The terms proximal and distal are used here merely to distinguish different portions of the same VCCD that are separated by the jog region. This embodiment advantageously may include a second column of pixels that includes a proximal set of second pixels and a distal set of second pixels separated by a second jog region. The first jog region is displaced in column direction 160 and in lateral direction 162 transverse to the column direction from the second jog region. Metal bus 125 is insulatively disposed over both the first and second jog regions.

In a variant, the proximal and distal sets of first pixels are displaced in lateral direction 162 transverse to column direction 160. A first end of the first jog region is displaced in the column direction and in the lateral direction from a second end of the first jog region. First metal 125 bus is insulatively disposed over both the first and second jog regions.

In a variant, the proximal set of first pixels is disposed along a first proximal line parallel to column direction 160. The distal set of first pixels is disposed along a first distal line parallel to column direction 160. The first proximal and distal lines are displaced by a fraction of a pixel pitch in lateral direction 162. The proximal set of second pixels is disposed along a second proximal line parallel to column direction 160. The distal set of second pixels is disposed along a second distal line parallel to column direction 160. The second proximal and distal lines are displaced by the fraction of the pixel pitch in lateral direction 162.

In another variant, each pixel includes a first region of high quantum efficiency (e.g., 3 of FIG. 1) and a second region of low quantum efficiency (e.g., 9 of FIG. 1). A maximum extent of the first region of a first pixel in the proximal set of first pixels defines a first reference extent 164, and a maximum extent of the second region of a first pixel in the proximal set of first pixels defines a first displaced extent 166. A sum of the first reference extent and the first displaced extent is substantially equal to one pixel pitch.

In yet another variant, a maximum extent of the first region of a first pixel in the distal set of first pixels defines second reference extent 168. The second reference extent projects in column direction 160 to substantially overlap the first displaced extent 166.

In still another variant, each pixel includes a first region of high quantum efficiency (e.g., 3 of FIG. 1) and a second region of low quantum efficiency (e.g., 9 of FIG. 1). The region of high quantum efficiency constitutes one of a photodiode and a pinned photodiode 103, and the region of low quantum efficiency constitutes a photo gate 170.

In yet still another variant, each pixel of the first column includes a first region of high quantum efficiency (e.g., 3 of FIG. 1) and a second region of low quantum efficiency (e.g., 9 of FIG. 1). The second region of each pixel of the first column includes a respective channel segment, and the channel segments of all pixels of the first column are linked end to end to form a first channel 109. The first regions of each pixel of the proximal set of first pixels are disposed on one side of the first channel 109, and the first regions of each pixel of the distal set of first pixels are disposed on another side of the first channel 109.

In still another variant, the sensor further includes a plurality of additional columns of pixels. Each addition column of pixels includes a corresponding jog region 120, and the first metal bus 125 is further insulatively disposed over the corresponding jog regions 120 of the plurality of additional columns of pixels.

In yet another variant, the first metal bus 125 is disposed at a first predetermined angle with respect to the column direction 160. The first predetermined angle might be, for example, substantially 45 degrees.

In yet still another variant, the first jog region 120, the second jog region 120 and the corresponding jog regions 120 of the plurality of additional columns of pixels align in a line disposed at a second predetermined angle with respect to the column direction 160. The second predetermined angle might be, for example, substantially 45 degrees.

While the method and device for providing uniform TDI response for DUV imaging have been described in connection with an exemplary embodiment, those skilled in the art will appreciate in light of these teachings that many modifications are possible, and this application is intended to cover any variations thereof.

Having described preferred embodiments of a novel reticulated gate CCD pixel with diagonal strapping (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A sensor comprising an array of pixels organized in rows and columns and a plurality of metal busses overlaying the array of pixels, wherein:
   a first column of pixels includes a proximal set of first pixels and a distal set of first pixels separated by a first jog region;
   a second column of pixels includes a proximal set of second pixels and a distal set of second pixels separated by a second jog region;
   the first jog region is displaced in a column direction and in a lateral direction transverse to the column direction from the second jog region; and a first metal bus is insulatively disposed over both the first and second jog regions.

2. The sensor of claim 1, wherein:

the proximal set of first pixels is disposed along a first proximal line parallel to the column direction;

the distal set of first pixels is disposed along a first distal line parallel to the column direction;

the first proximal and distal lines are displaced by a fraction of a pixel pitch in the lateral direction;

the proximal set of second pixels is disposed along a second proximal line parallel to the column direction;

the distal set of second pixels are disposed along a second distal line parallel to the column direction; and the second proximal and distal lines are displaced by the fraction of the pixel pitch in the lateral direction.

3. The sensor of claim 2, wherein:

each pixel includes a first region of high quantum efficiency and a second region of low quantum efficiency;

a maximum extent of the first region of a first pixel in the proximal set of first pixels defines a first reference extent;

a maximum extent of the second region of a first pixel in the proximal set of first pixels defines a first displaced extent;

a sum of the first reference extent and the first displaced extent is substantially equal to one pixel pitch.

4. The sensor of claim 3, wherein:

a maximum extent of the first region of a first pixel in the distal set of first pixels defines a second reference extent;

the second reference extent projects in the column direction to substantially overlap the first displaced extent.

5. The sensor of claim 2, wherein:

each pixel includes a first region of high quantum efficiency and a second region of low quantum efficiency;

a maximum extent of the first region of a first pixel in the distal set of first pixels defines a first reference extent;

a maximum extent of the second region of a first pixel in the proximal set of first pixels defines a first displaced extent; and the first reference extent projects in the column direction to substantially overlap the first displaced extent.

6. The sensor of claim 1, wherein:

each pixel includes a first region of high quantum efficiency and a second region of low quantum efficiency;

the first region constitutes one of a photodiode and a pinned photodiode; and the second region constitutes a photo gate.

7. The sensor of claim 1, wherein:

each pixel of the first column includes a first region of high quantum efficiency and a second region of low quantum efficiency;

the second region of each pixel of the first column includes a respective channel segment;

the channel segments of all pixels of the first column are linked end to end to form a first channel;

the first regions of each pixel of the proximal set of first pixels are disposed on one side of the first channel; and the first regions of each pixel of the distal set of first pixels are disposed on another side of the first channel.

8. The sensor of claim 1, further comprising a plurality of additional columns of pixels, wherein:

each addition column of pixels includes a corresponding jog region;

the first metal bus is further insulatively disposed over the corresponding jog regions of the plurality of additional columns of pixels.

9. The sensor of claim 8, wherein the first metal bus is disposed at a first predetermined angle with respect to the column direction.

10. The sensor of claim 9, wherein the first predetermined angle is substantially 45 degrees.

11. The sensor of claim 8, wherein the first jog region, the second jog region and the corresponding jog regions of the plurality of additional columns of pixels align in a line disposed at a second predetermined angle with respect to the column direction.

12. The sensor of claim 11, wherein the second predetermined angle is substantially 45 degrees.

13. A sensor comprising an array of pixels organized in rows and columns and a plurality of metal busses overlaying the array of pixels, wherein:

a first column of pixels includes a proximal set of first pixels and a distal set of first pixels separated by a first jog region;

a second column of pixels includes a proximal set of second pixels and a distal set of second pixels separated by a second jog region;

a first metal bus is insulatively disposed over both the first and second jog regions;

the proximal set of first pixels is disposed along a first proximal line parallel to the column direction;

the distal set of first pixels is disposed along a first distal line parallel to the column direction; and the first proximal and distal lines are displaced by a fraction of a pixel pitch in the lateral direction.

* * * * *

UNITED STATES PATENT AND TRADEMARK OFFICE
CERTIFICATE OF CORRECTION

| | | |
|---|---|---|
| PATENT NO. | : 7,105,876 B1 | Page 1 of 1 |
| APPLICATION NO. | : 10/079425 | |
| DATED | : September 12, 2006 | |
| INVENTOR(S) | : Stacy R. Kamasz et al. | |

It is certified that error appears in the above-identified patent and that said Letters Patent is hereby corrected as shown below:

Column 9, line 12 reads "the distal set of second pixels are disposed" should read -- the distal set of second pixels is disposed --

Signed and Sealed this

Sixth Day of March, 2007

JON W. DUDAS
*Director of the United States Patent and Trademark Office*